United States Patent [19]

Ichihara

[11] Patent Number: 5,410,195
[45] Date of Patent: Apr. 25, 1995

[54] RIPPLE-FREE PHASE DETECTOR USING TWO SAMPLE-AND-HOLD CIRCUITS

[75] Inventor: Masaki Ichihara, Tokyo, Japan

[73] Assignee: NEC Corporation, Tokyo, Japan

[21] Appl. No.: 968,575

[22] Filed: Oct. 29, 1992

[30] Foreign Application Priority Data

Oct. 31, 1991 [JP] Japan ................ 3-313437

[51] Int. Cl.[6] ............................................. H03K 5/26
[52] U.S. Cl. ............................................. 327/10; 327/94
[58] Field of Search ............... 307/514, 516, 519, 526, 307/353; 328/133, 134, 155

[56] References Cited

U.S. PATENT DOCUMENTS

| | | | |
|---|---|---|---|
| 4,358,736 | 11/1982 | DeBoer | 328/133 |
| 4,523,150 | 6/1985 | Hogeboom | 307/519 |
| 4,641,324 | 2/1987 | Karsh et al. | 307/353 |
| 4,698,523 | 10/1987 | Gershon et al. | 307/353 |
| 5,006,819 | 4/1991 | Buchan et al. | 331/1 A |
| 5,034,633 | 7/1991 | Stekelenburg | 307/353 |
| 5,157,341 | 10/1992 | Fobbester et al. | 307/514 |
| 5,170,075 | 12/1992 | De Wit | 307/353 |
| 5,179,301 | 1/1993 | Hughes | 307/353 |
| 5,331,230 | 7/1994 | Ichihara | 307/514 |

*Primary Examiner*—Willis R. Wolfe
*Attorney, Agent, or Firm*—Young & Thompson

[57] ABSTRACT

A phase detector comprises a ramp voltage generator for receiving a reference pulse of a constant frequency and an input pulse and producing a ramp voltage proportional to the phase difference between these pulses. A first sample-and-hold circuit samples the ramp voltage in response to a sampling pulse and holds the sampled voltage. To eliminate ripple component, a second sample-and-hold circuit is provided, which is also responsive to the sampling pulse for sampling a voltage from a constant voltage source and holding the sampled voltage. The voltages sampled by the first and second sample-and-hold circuits are input to a subtractor where the voltage difference between the two input voltages is detected. Ripple components generated by the two sample-and-hold circuits are cancelled out by the subtractor.

5 Claims, 2 Drawing Sheets

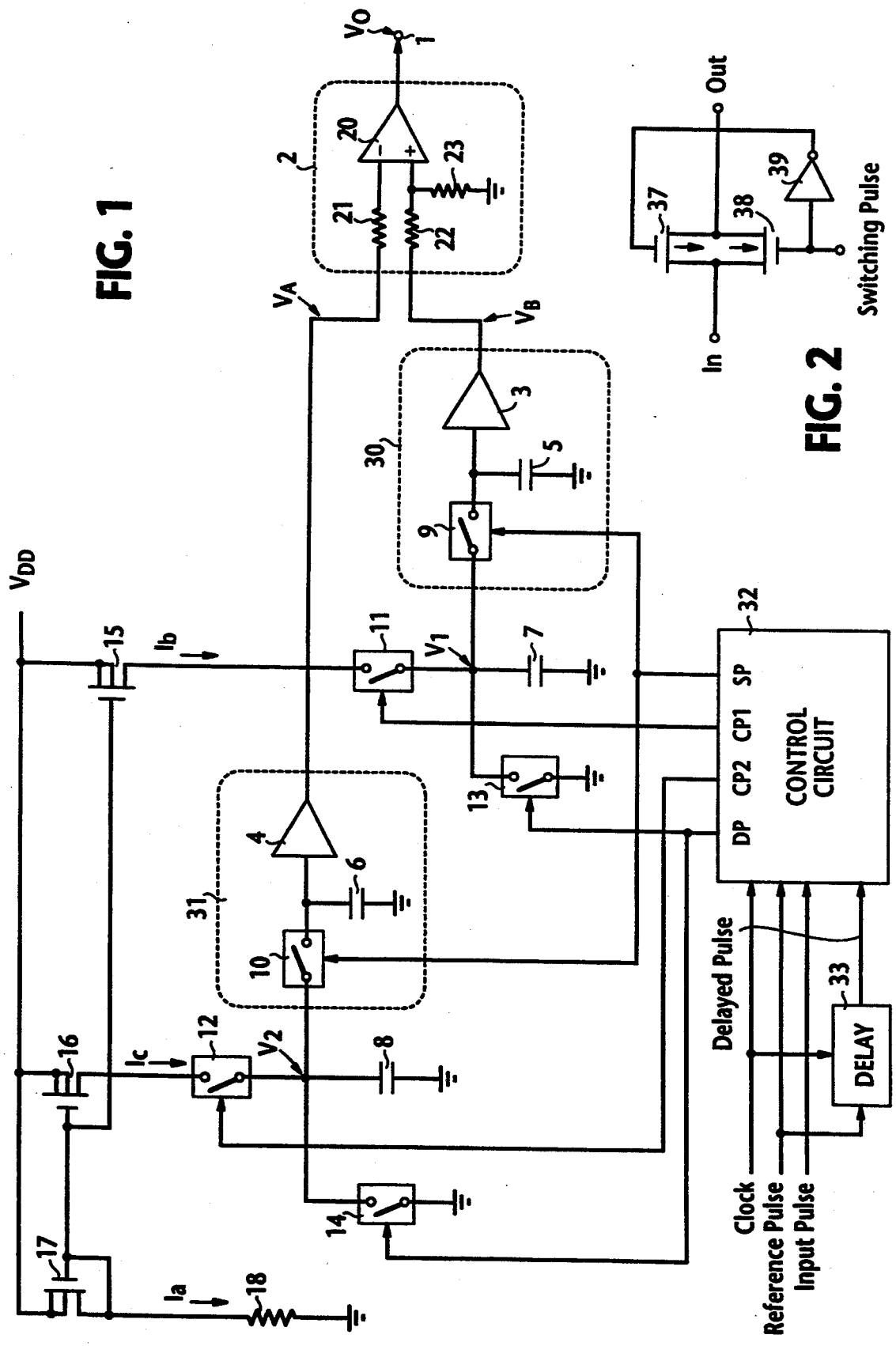
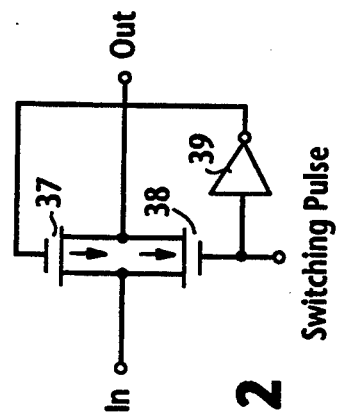
FIG. 1
FIG. 2

RIPPLE-FREE PHASE DETECTOR USING TWO SAMPLE-AND-HOLD CIRCUITS

BACKGROUND OF THE INVENTION

The present invention relates generally to phase detectors for phase lock loops, and more specifically to a sample-hold phase detector which generates a ramp voltage proportional to a phase difference between two input signals and samples and holds the ramp voltage to produce a phase detectpr output.

According to the prior art sample-hold phase detector, a "ramp" capacitor is charged for an interval corresponding to a phase difference between an input signal and a reference signal to develop a ramp voltage proportional to the phase difference. A sample-and-hold circuit is connected to the ramp capacitor to sample and hold the ramp voltage in response to a sampling pulse. With the recent tendency toward LSI implementation of electronic circuitry, it is desirable to fabricate all components of the sample-and-hold circuit on a single LSI chip. However, the value of the storage capacitor of the sample-and-hold circuit cannot be made sufficiently large to prevent the applied sampling pulse from bypassing the "sample" switch of the sample-and-hold circuit by way of the parasitic capacitance of the switch, to the storage capacitor. Therefore, the phase detector output contains an undesirable ripple voltage which occurs at the same frequency as the reference signal.

SUMMARY OF THE INVENTION

It is therefore an object of the present invention to provide a phase detector which enables the implementation of sample-hold phase detectors using LSI technology.

According to the present invention, a ramp voltage generator is provided for receiving a reference pulse of a constant frequency and an input pulse from an external source and producing a ramp voltage proportional to the phase difference between these pulses. A first sample-and-hold circuit samples the ramp voltage in response to a sampling pulse and holds the sampled voltage. Further provided is a second sample-and-hold circuit which is also responsive to the sampling pulse for sampling a constant voltage and holding the sampled voltage. The voltages sampled by the first and second sample-and-hold circuits are input to a subtractor where the voltage difference between the input voltages is detected. Undesirable ripple components, which are generated by the two sample-and-hold circuits, are effectively cancelled out by the subtractor.

Preferably, a delay circuit is provided to receive the reference pulse as a first reference pulse and delay it to produce a second reference pulse. A second ramp voltage generator produces the constant voltage that is proportional to the interval between the first and second reference pulses.

BRIEF DESCRIPTION OF THE DRAWINGS

The present invention will be described in further detail with reference to the accompanying drawings, in which:

FIG. 1 is a block diagram of a phase detector according to the present invention;

FIG. 2 shows details of each of the switches used in FIG. 1; and

DETAILED DESCRIPTION

Figure 3:
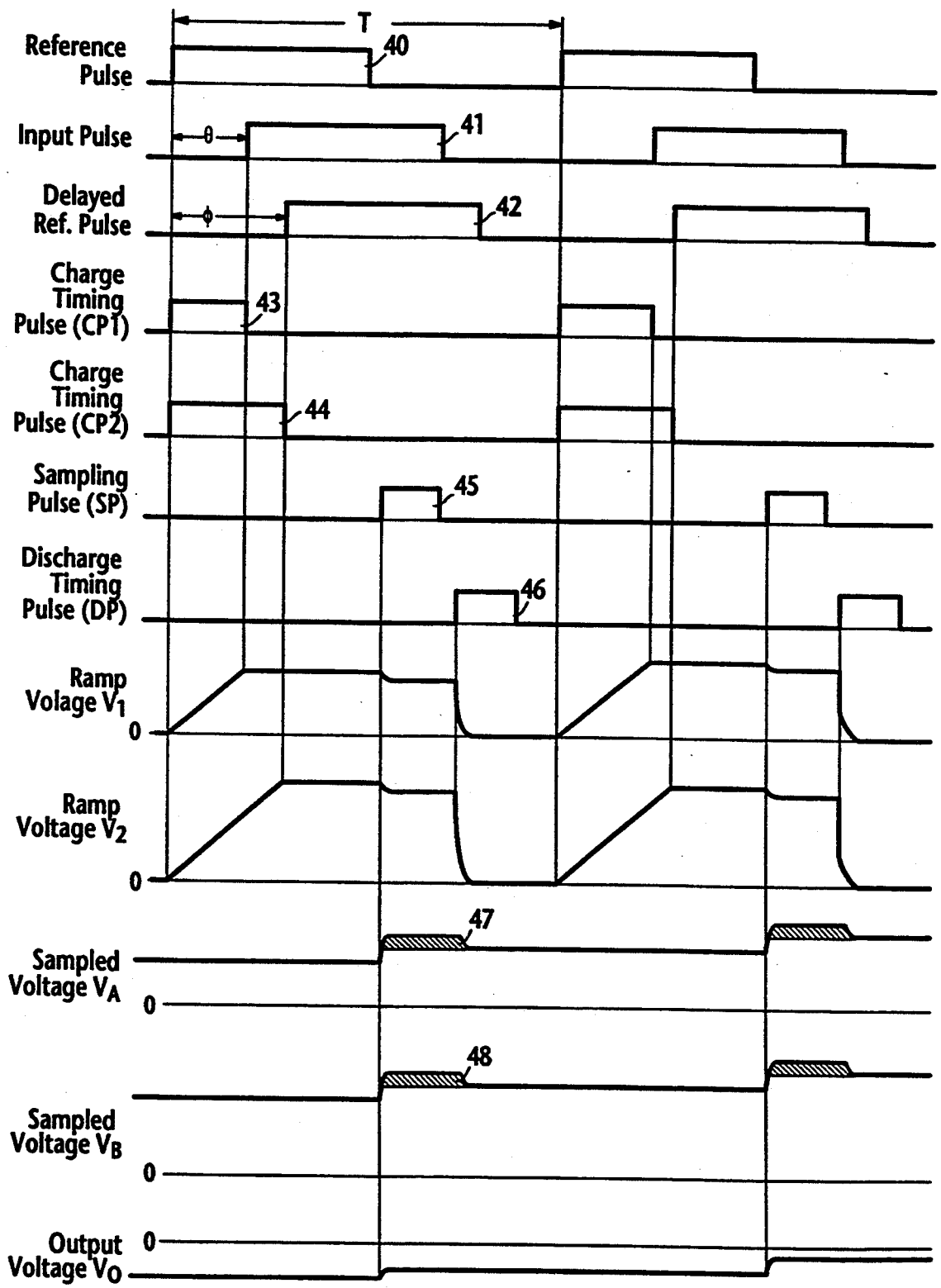
FIG. 3 is a timing diagram showing waveforms of the various signals generated in FIG. 1.

Referring now to FIG. 1, the phase detector of the present invention comprises a first sample-and-hold circuit 30 and a second sample-and-hold circuit 31 identical to the first sample-and-hold circuit 30. First sample-and-hold circuit 30 includes a storage capacitor 5 connected between ground and the input of a buffer amplifier 3, and a sampling switch 9 connected between a first ramp capacitor 7 and the input of amplifier 3. A first charge timing switch 11 is connected to the ramp capacitor 7 for charging it with a current supplied from a p-channel MOS (metal oxide semiconductor) transistor 15 in response to a charge command pulse CP1 from a control circuit 32. A first discharge timing switch 13 is connected to the ramp capacitor 7 for discharging it in response to a discharge command pulse DP. Therefore, a first ramp voltage is developed across the first ramp capacitor 7. The sampling switch 9 is responsive to a sampling pulse SP from the control circuit to sample and transfer the energy stored in the first ramp capacitor 7 into the storage capacitor 5 where the sampled voltage is held until the next sampling instant.

Likewise, the second sample-and-hold circuit 31 includes a storage capacitor 6 connected to the input of a buffer amplifier 4, and a sampling switch 10 connected between a second ramp capacitor 8 and the input of amplifier 4. A second charge timing switch 12 is connected to the second ramp capacitor 8 for charging it with a current supplied from a p-channel MOS transistor 16 in response to a pulse CP2 from the control circuit. A second discharge timing switch 14 is connected to the second ramp capacitor 8 for discharging it in response to the discharge command pulse DP. Therefore, a second ramp voltage is developed across the capacitor 8. Similar to sampling switch 9, sampling switch 10 is responsive to the sampling pulse SP to sample and transfer the energy stored in the second ramp capacitor 8 into the storage capacitor 6 to hold the sampled voltage.

Transistors 15 and 16 are of identical structure and their gate electrodes are connected together to the gate electrode of a p-channel MOS transistor 17 which is connected to ground through a resistor 18. Specifically, transistor 17 provides a drain current $I_a$ which is given by:

$$I_a = (V_{DD} - V_{GS})/R \qquad (1)$$

where $V_{DD}$ is the source voltage and $V_{GS}$ is the gate-source voltage of transistor 17, and R is the value of resistor 18. Transistor 15 forms a current mirror circuit with transistor 17 and the drain current $I_b$ of transistor 15 is:

$$I_a = (I_b)(N_1) \qquad (2)$$

where $N_1 = (W_{15}/L_{15})(L_{17}/W_{17})$, where $W_{15}$ and $W_{17}$ are channel widths of transistors 15, 17, and $L_{15}$ and $L_{17}$ are channel lengths of transistors 15, 17. Likewise, transistor 16 forms a current mirror circuit with transistor 17, and therefore, the drain current $I_c$ of transistor 16 is given by:

$$I_a = (I_c)(N_2) \qquad (3)$$

where $N_2=(W_{16}/L_{16})(L_{17}/W_{17})$, where $W_{16}$ and $L_{16}$ are the channel width and length of transistor 16. Since transistors 15 and 16 are of identical structure, $N_1=N_2=N$, currents $I_b$ and $I_c$ are of the same value and are uniquely determined by resistor 18. Therefore, the voltages developed in the first and second ramp capacitors 7 and 8 are respectively linearly proportional to the duration of the charge command pulses CP1 and CP2.

All capacitors of the phase detector are implemented using LSI technology and incorporated into the same LSI chip with other circuit elements of the phase detector.

As shown in FIG. 2, all switches of the phase detector are implemented with analog transmission gates that allows a voltage of any amplitude value to be passed from its input to its output in response to a switching pulse applied from the control circuit. Each switch comprises a pair of complementary MOS transistors 37 and 38 with the source and drain electrodes of each transistor being connected to the corresponding electrodes of the other and the gate of transistor 38 being coupled through an inverter 39 to the gate of transistor 37.

The outputs of buffer amplifiers 3 and 4 are coupled respectively to inputs of a differential amplifier, or subtractor 2, which is typically implemented with an operational amplifier 20, resistors 21, 22 through which the buffer amplifier outputs are respectively coupled to the inverting and noninverting inputs of the operational amplifier, and a resistor 23 coupling the noninverting input to ground. The output of operational amplifier 20 is connected to the phase detector output terminal 1.

Control circuit 32, driven by externally generated clock pulses, receives a reference pulse which occurs at interval T and an input pulse supplied from an external source. The phase timing of the input pulse is compared with the reference pulse to produce a first charge timing pulse CP1 of duration corresponding to the phase difference $\theta$ as shown in FIG. 3. The reference pulse is also input to a delay circuit 33 where it is delayed by a prescribed interval $\phi$ to produce a delayed reference pulse, which is input to control circuit 32. Control circuit 32 produces a second charge timing pulse CP2 of duration corresponding to the prescribed interval $\phi$. Control circuit 32 further generates a sampling pulse SP and a discharge timing pulse DP in succession during the interval between the trailing edge of a reference pulse and the leading edge of the next reference pulse.

The following is a description of the operation of the phase detector of the present invention with reference to FIG. 3.

When the phase detector receives a reference pulse 40 and an input pulse 41 at intervals $\theta$, a CP1 command pulse 43 of duration $\theta$ is output from control circuit 32 to the first charge timing switch 11, thus drawing a current $I_b$ from the transistor 15 into the first ramp capacitor 7 to develop a ramp voltage $V_1$ which is given by:

$$V_1 = (I_b)(\theta)(T)/(2\pi)(C_7) \quad (4)$$

where $C_7$ is the value of ramp capacitor 7 and the delay interval $\theta$ is given in units of radian. By substituting Equation (2) into Equation (4), the following relation is obtained:

$$\begin{aligned} V_1 &= (\theta)(T)(N)(V_{DD} - V_{GS})/(2\pi)(C_7)(R) \\ &= (K)(\theta)/(C_7)(R) \end{aligned} \quad (5)$$

where K is the phase-to-voltage conversion coefficient and is given by the relation $(T)(N)(V_{DD}-V_{GS})/2\pi$.

Concurrently, a CP2 command pulse 44 of duration $\phi$ is applied to the second charge timing switch 12. A current $I_c$ is drawn from the transistor 16 into the second ramp capacitor 8, ($C_8$) to develop a ramp voltage $V_2$ which is given by:

$$\begin{aligned} V_2 &= (I_c)(\phi)(T)/(2\pi)(C_8) \quad (6) \\ &= (\phi)(T)(N)(V_{DD} - V_{GS})/(2\pi)(C_8)(R) \\ &= (K)(\phi)/(C_8)(R) \quad (7) \end{aligned}$$

In response to a sampling pulse 45 the first and second sampling switches 9 and 10 are operated to sample and transfer the voltages $V_1$ and $V_2$ from the ramp capacitors 7 and 8 to the storage capacitors 5 and 6, respectively. A discharge command pulse 46 is then input to switches 13 and 14 to discharge the ramp capacitors 7 and 8 completely. If the value of each storage capacitor is much smaller than the value of the corresponding ramp capacitor, the voltages stored in the capacitors 5 and 6 are substantially equal to voltages $V_1$ and $V_2$, respectively.

Through buffer amplifiers 3 and 4, the sampled voltages $V_1$ and $V_2$ appear respectively as voltages $V_A$ and $V_B$ at the inputs of subtractor 2 where the difference between the input voltages $V_A$ and $V_B$ is detected and output to the terminal 1. Since voltage $V_2$ attains a constant amplitude at the instant it is sampled as given by Equation (7), the difference between sampled voltages $V_1$ and $V_2$, and hence $V_A$ and $V_B$ is proportional to the phase difference $\theta$.

Because of the small capacitance values of the storage capacitors 5 and 6, a feedthrough effect occurs through the sampling switches 9 and 10. Therefore, the sampling pulse applied to the first sample-and-hold circuit 30 finds a leakage path through switch 9 to capacitor 5 to develop a ripple voltage, as indicated by hatching 47, which is superposed on the sampled voltage $V_1$. In like manner, the sampling pulse applied to the second sample-and-hold circuit 31 finds a leakage path through switch 10 to capacitor 6 to develop a ripple of the same magnitude as ripple voltage 47, as indicated by hatching 48, which is superposed on the sampled voltage $V_2$. However, due to the differential action of subtractor 2, the leakage voltages 47 and 48 are cancelled out, thus producing a phase detector output voltage $V_O$ indicative of the difference between voltages VA and VB at the output terminal 1.

Since the second ramp voltage attains a constant level in so far as the interval between the non-delayed and delayed reference pulses remains constant, it could equally be as well provided by an external source of constant voltage, instead of by the ramp voltage generating circuit formed by capacitor 8, switches 12, 14, delay circuit 33 and control circuit 32.

What is claimed is:
1. A phase detector comprising:
   ramp voltage generating means for receiving a reference pulse of a predetermined constant frequency and an input pulse and developing a ramp voltage proportional to a phase difference between the reference pulse and said input pulse;

means for generating a sampling pulse subsequent to the reference pulse;

first sample-and-hold means for sampling said ramp voltage in response to the sampling pulse;

second sample-and-hold means for sampling a constant voltage in response to said sampling pulse; and means for detecting a voltage difference between the voltages sampled by said first and second sample-and-hold means.

2. A phase detector as claimed in claim 1, further comprising:

delay means for receiving said reference pulse as a first reference pulse and producing a second reference pulse delayed by a prescribed interval with respect to the first reference pulse; and second ramp voltage generating means for receiving said first and second reference pulses and developing said constant voltage proportional to said prescribed interval.

3. A phase detector comprising:

a first integrated-circuit capacitor;

charging means for receiving a reference pulse of a predetermined constant frequency and an input pulse, and drawing a current at a constant rate into the first integrated-circuit capacitor during an interval corresponding to a phase difference between the reference pulse and said input pulse to develop a ramp voltage in said first integrated-circuit capacitor;

a first integrated-circuit sample-and-hold circuit connected to said first integrated-circuit capacitor;

second integrated-circuit sample-and-hold circuit connected to a source of constant voltage;

sampling means for causing said first and second integrated-circuit sample-and-hold circuits to sample said ramp voltage and said constant voltage, respectively, during an interval subsequent to said reference pulse; and means for detecting a voltage difference between the voltages sampled by said first and second sample-and-hold circuits.

4. A phase detector as claimed in claim 3, wherein said source of constant voltage comprises:

delay means for receiving said reference pulse as a first reference pulse and producing a second reference pulse delayed by a prescribed interval with respect to the first reference pulse;

a second integrated-circuit capacitor; and second charging means for receiving said first and second reference pulses and drawing a current at said constant rate into said second integrated-circuit capacitor during an interval corresponding to said prescribed interval.

5. A phase detector comprising:

a switching pulse source for receiving a first reference pulse of a predetermined constant frequency and an input pulse and producing said first charge timing pulse of duration corresponding to a phase difference between said first reference pulse and said input pulse, for receiving a second reference pulse of said predetermined constant frequency and producing a second charge timing pulse of constant duration corresponding to a phase difference between said first and second reference pulses, and for successively producing a sampling pulse and a discharge timing pulse during an interval following a trailing edge of said first reference pulse;

first and second identical constant current sources;

a first capacitor;

first switch means for drawing a current from the constant current source into the first capacitor in response to said first charge timing pulse and drawing a current from the first capacitor in response to said discharge timing pulse;

a first sample-and-hold circuit responsive to said sampling pulse for sampling a voltage developed in the first capacitor and holding the sampled voltage;

a second capacitor;

second switch means for drawing a current from the constant current source into the second capacitor in response to said second charge timing pulse and drawing a current from the second capacitor (8) in response to said discharge timing pulse;

a second sample-and-hold circuit responsive to said sampling pulse for sampling a voltage developed in the second capacitor and holding the sampled voltage; and means for detecting a voltage difference between the voltages sampled by said first and second sample-and-hold circuits.

* * * * *